United States Patent [19]

Raj

[11] Patent Number: 5,102,720

[45] Date of Patent: Apr. 7, 1992

[54] CO-FIRED MULTILAYER CERAMIC TAPES THAT EXHIBIT CONSTRAINED SINTERING

[75] Inventor: Rishi Raj, Ithaca, N.Y.

[73] Assignee: Cornell Research Foundation, Inc., Ithaca, N.Y.

[21] Appl. No.: 410,825

[22] Filed: Sep. 22, 1989

[51] Int. Cl.⁵ ............................................... B32B 9/00
[52] U.S. Cl. ........................... 421/209; 428/210; 428/323; 428/426; 428/432; 428/433; 428/688; 428/901; 156/89; 361/397; 361/401
[58] Field of Search ............... 428/209, 210, 323, 426, 428/432, 433, 688, 901; 156/89; 361/397, 401

[56] References Cited

U.S. PATENT DOCUMENTS

| | | | |
|---|---|---|---|
| T888,004 | 7/1971 | Keller | 156/89 |
| 4,221,047 | 9/1980 | Narken | 29/40 |
| 4,234,367 | 11/1980 | Herron | 156/89 |
| 4,301,324 | 11/1981 | Kumar | 174/68.5 |
| 4,313,900 | 2/1982 | Gonzales, Jr. et al. | 264/133 |
| 4,600,604 | 7/1986 | Siuta | 428/403 |
| 4,645,552 | 2/1987 | Vitriol | 156/89 |
| 4,799,984 | 1/1989 | Rellick | 29/851 |
| 4,806,188 | 2/1989 | Rellick | 29/851 |

FOREIGN PATENT DOCUMENTS 054964 3/1985 Japan.
054966 3/1985 Japan.

OTHER PUBLICATIONS

Influence of Glass Additions on Particle Size Distribution Effects in Type Casting of $BaTiO_3$, Blum et al., J. Am Chem Soc, 68(9) 233–234 (1985).

Blodgett, A. J. et al., IBM J. Res. Develop. 26, 1, pp. 30–36 (1982).

*Primary Examiner*—Patrick J. Ryan

[57] ABSTRACT

Shrinkage is substantially reduced or eliminated in the x-y plane during co-firing interposing predominantly ceramic layer between predominantly glass layers in the green multilayer assembly. The ceramic is preferably aluminum nitride.

20 Claims, 3 Drawing Sheets

CO-FIRED MULTILAYER CERAMIC TAPES THAT EXHIBIT CONSTRAINED SINTERING

TECHNICAL FIELD

This invention is directed to multilayer substrates for electronic and opto-electronic applications.

BACKGROUND OF THE INVENTION

Ceramic substrates are employed in electronic packaging applications. Multilayer substrates that are interspersed with metallic connects are used to support and wire several electronic or opto-electronic components in order to construct a functional module. The state-of-the-art in multilayer ceramic substrate technology has been represented by the IBM multilayer ceramic substrate as described in Blodgett, A.J., et al, IBM J. Res. Develop. 26, 1, pp. 30-36 (1982). The IBM multilayer ceramic substrate is prepared by laminating alumina ceramic tapes and screen printed metal pastes. This "green" structure is then co-fired at approximately 1700° C. in a reducing hydrogen containing atmosphere. The substrate shrinks in the x, y, and z directions during sintering, approximately 17% in each direction, and such shrinkage in the x-y plane may cause interface defects and delamination.

The above technology has evolved so that glass or glass ceramic dielectrics are being used in place of alumina to reduce the sintering temperature to less than 1000° C. so that copper can be used for metallization. Furthermore, attempts have been made to restrict x-y shrinkage by attaching the dielectric tapes to a monolithic substrate before sintering. In general, this restricts the ability to co-fire multilayer assemblies.

The present invention essentially eliminates x-y plane shrinkage and the associated delamination without requiring attachment to a monolithic substrate.

SUMMARY OF THE INVENTION

The above advantage is obtained by providing a particular multilayer green substrate assembly for sintering to produce a multilayer circuit.

The multilayer green substrate assembly herein comprises (a) at least one layer predominantly containing glass particles held together by an organic binder;

(b) at least one layer predominantly containing ceramic particles held together by an organic binder, said ceramic particles being such as to remain rigid at sintering temperatures and being such as to stabilize the substrate against shrinkage in the x-y plane on sintering and to substantially constrain shrinkage on sintering to the z-direction;

(c) at least one layer of (a) or (b) or (a) and (b) being printed with a metal conductive pattern.

Preferably the multilayer green substrate assembly has each layer (a) containing on a glass plus ceramic basis at least 60% by volume glass (i.e., 100% to 60% by volume glass and 0% to 40% by volume ceramic on a glass plus ceramic basis) and has each layer (b) containing on a glass plus ceramic basis at least 60% by volume ceramic (i.e. 100% to 60% by volume ceramic and 0% to 40% by volume glass on a glass plus ceramic basis) and the glass has a sintering temperature ranging from 600° C. to 1500° C., very preferably from 800° C. to 900° C., and the ceramic is selected from the group consisting of carbides, nitrides, oxides and borides, and very preferably is aluminum nitride, or is diamond or poorly crystallized carbon (i.e., diamond-like). Very preferably the multilayer green substrate assembly has each layer (b) containing on a glass plus ceramic basis from 90% to 70% by volume ceramic and from 10% to 30% by volume glass.

The product after sintering is a multilayer substrate for mounting of electronic or opto-electronic components.

This product substrate comprises (a) at least one layer which has a glass matrix and has a porosity from 0 to 10% by volume and contains from 0 to 60% by volume ceramic and from 100% to 30% glass;

(b) at least one layer which contains at least 60% by volume ceramic particles with the remainder being any combination of porosity and glass.

Typically in the product substrate at least one of (a) or (b) or (a) and (b) is printed with a metal conductive pattern of lines and vias.

Preferably the product substrate is self-supporting.

Each layer (a) of the product substrate typically has a low dielectric constant and each layer (b) of the product substrate has either a low or high dielectric constant or is a resistor. In one embodiment a layer (b) has a very high dielectric constant so as to provide opto-electric properties. Each layer (a) can be the same or different in composition, depending on the application. Each layer (b) can be the same or different in composition, depending on the application.

In one embodiment the product substrate is built on a monolithic ceramic substrate of ceramic selected from carbides, nitrides, oxides and borides.

In one aspect of the invention herein there is provided a method for producing a self standing substrate for a multilayer circuit. This method utilizes the conventional steps of tape casting, screen printing, stacking, laminating, drying and removing organic binder to provide a green multilayer assembly, and co-firing. The improvement herein comprises sintering (co-firing) the self-standing substrate with shrinkage essentially only in the z-direction and essentially no shrinkage in the x-y plane. This has not heretofore been accomplished. This is accomplished by including in the green substrate assembly at least one predominantly ceramic layer (100 to 60% by volume ceramic and 0 to 40% by volume glass on a ceramic plus glass basis) among predominantly glass layers (100% to 60% by volume glass and 0 to 40% by volume ceramic on a glass plus ceramic basis) to stabilize the assembly against x-y plane shrinkage on sintering. Sintering is carried out at a desirably low temperature of less than 1000° C., preferably in the range of 800° C. to 900° so the glass fuses to produce a product as described above. In this product, the glass in the glass layers fuses to form a matrix and can infiltrate into adjacent predominantly ceramic layers to provide coherency and any glass in the ceramic layers fuses to provide coherency in these layers. Preferably the green multilayer assembly is built on a monolithic ceramic substrate (preferably selected from the group consisting of nitrides, carbides, oxides and borides) to provide greater reliability by elimination of delamination and interface defects that otherwise result from shrinkage in the x-y plane. In one embodiment the co-firing (sintering) is carried out under a pressure applied in the z-direction, e.g., provided by positioning a weight on the green substrate assembly, in the range of 3 to 30 psi; this improves adhesion between layers and reduces the possibility of warping and in the embodiment where the green assembly is built on a monolithic ceramic substrate also improves adhesion between the multilayer assembly and the monolithic substrate.

Glass as the term is used herein means a material that changes its viscosity continuously as the temperature is increased. This change in viscosity is characterized by the annealing point, the softening point, and the working point of the glass.

A ceramic as the term is used herein means a material with a sharp melting temperature at which point the material changes from essentially solid to essentially liquid.

The expression "glass plus ceramic basis" is used herein to mean the percentages of the total of glass and ceramic with other components that may be present excluded.

The terms x-y plane and z-direction are used herein to mean respectively a horizontal plane and a vertical direction.

In the figures the section lines for liquid indicate predominantly glass, the section lines for refractory indicate predominantly ceramic and the section lines for metal indicate predominantly metal.

DETAILED DESCRIPTION

Figure 1:
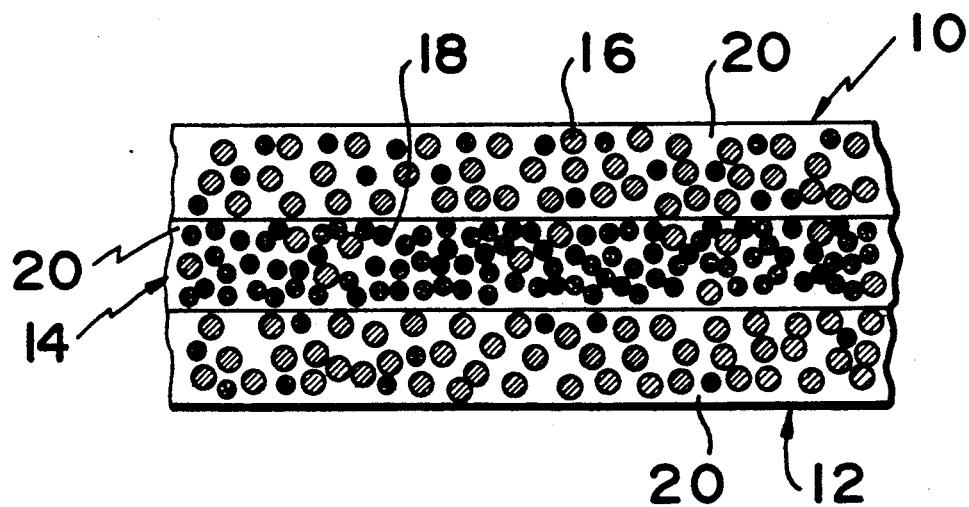
FIG. 1 is a schematic representation of a microstructure of a multilayer green substrate with metallization omitted for simplification.

With reference to FIG. 1, there is depicted a three layer green structure containing predominantly glass outer layers 10 and 12 and predominantly ceramic middle layer 14. The layers 10 and 12 consist of a major portion of glass particles and some ceramic particles held together by organic binder. The layer 14 consists of a major portion of ceramic particles and some glass particles held together with organic binder. The glass particles are depicted as lined circles 16 and the ceramic particles are depicted as filled in circles 18 and the binder is depicted as matrix material 20.

Each of the layers is made up in conventional fashion by mixing appropriate quantities of glass particles and ceramic particles, organic binder and solvent, deaerating and then tape casting on a polymer surface using a doctor blade. Then the layers are dried in air and peeled from the polymer. The resulting dried tapes are stacked and pressed under moderate pressure, e.g. 10 psi, and slightly elevated temperature such as 80° C. After drying, binder is burned off by heating in air in an oven at 200° to 300° C. for several hours. In processing to provide the structure of FIG. 1, predominantly glass, predominantly ceramic and predominantly glass dried tapes are formed into a stack which is pressed, and after drying, binder is burned off.

The particles sizes for glass particles typically range from 0.1 to 100 microns, preferably from 1 to 20 microns. The particle sizes for ceramic particles typically range from 0.01 to 50 sizes can be used to obtain higher packing densities in the green state.

The glass particles should preferably have good wetting properties vis-a-vis the ceramic.

The ceramic particles can be, for example, alumina, silicon carbide, titanium boride, barium titanate, beryllia, diamond, poorly crystallized carbon (diamond-like) and preferably are of aluminum nitride. Any ceramic is functional which is wetted by the glass without significant dissolution or sintering. The particular ceramic is selected according to the following functions: low dielectric constant for fast interconnects (e.g., aluminum nitride or cordierite); high dielectric constant for capacitors (e.g., barium titanate); high thermal conductivity (e.g., aluminum nitride or diamond); resistor property (vanadium pentoxide).

The binders and solvents are represented by those conventionally used for tape casting and are readily commercially available.

Figure 2:
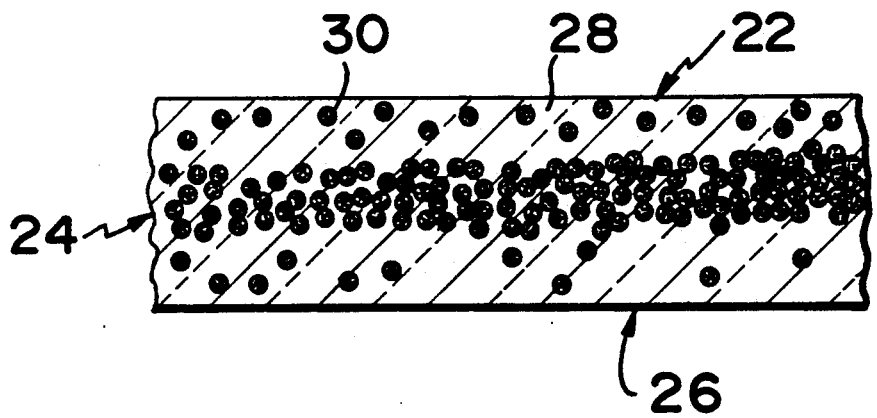
FIG. 2 is a schematic representation of microstructure obtained after co-firing the multilayer green substrate of FIG. 1.

Turning now to FIG. 2, there is depicted the structure resulting from co-firing of the structure of FIG. 1. As depicted in FIG. 2, there are three interdiffused layers or portions 22, 24 and 2 wherein the glass particles have fused in all layers to provide a matrix for the entire structure denoted 28 which surrounds the ceramic particles denoted as filled circles 30. The top and bottom layers 22 and 26 consist mainly of glass matrix and some ceramic particles and the middle layer 24 consists mainly of ceramic particles with a minor portion thereof providing the glass matrix which holds the middle layer together and binds it to the layers 22 and 26. The layer 24 functions to constrain shrinkage to the z-direction. The sintering (co-firing) can be carried out in a conventional sintering furnace. The sintering temperature is determined by the softening point of the glass and typically lies between the softening point and the working point. In a preferred embodiment herein the sintering temperature ranges from 800° to 900° C. and the glass composition is selected accordingly with a particular glass structure for this range described hereafter.

The three layer tape as depicted in FIG. 1 is just exemplary, and can be, for example, 5 or 7 or 9 layers etc. alternating between predominantly glass and predominantly ceramic layers with the predominantly glass layers defining the top and bottom surfaces. This green multilayer structure can be sold as an article of commerce for fabrication of functional multilayer electronic packages where the multilayer green tape as just described is used in place of a conventional commercially available single layer tape for screen printing, via formation and stacking.

As indicated in the above paragraph, the application of the invention herein can constitute a super-assembly of a plurality of multilayer alternating predominantly glass/predominantly ceramic layers.

Figure 3:
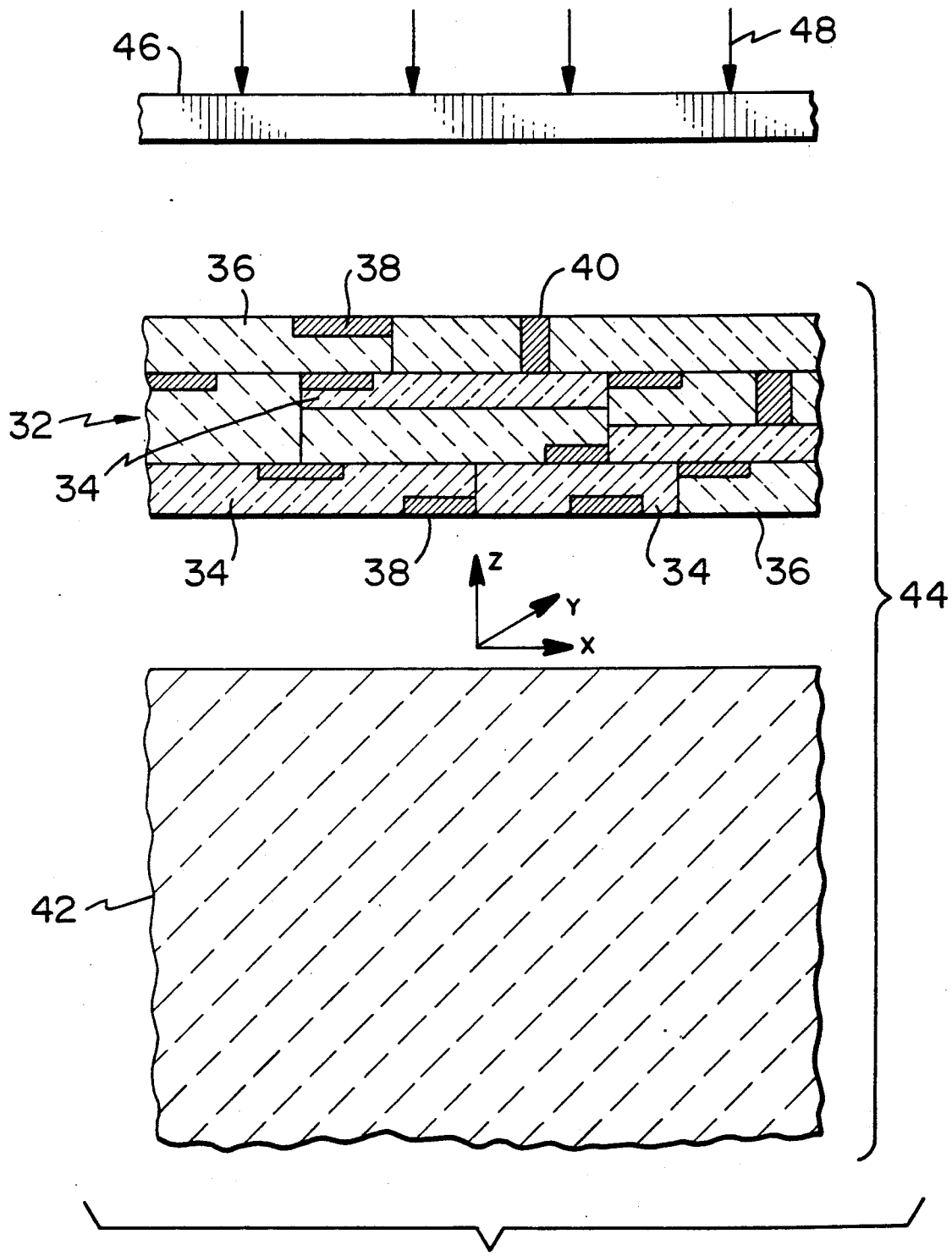
FIG. 3 depicts in the middle portion in section a green multilayer structure that is embraced by the invention which optionally can be built on a monolithic ceramic structure depicted in section at the bottom and in the top portion schematically depicts optional pressurization by the application of a load in the z-direction during sintering. The x, y and z-directions are indicated.

Turning to FIG. 3, there is depicted a green multilayer fabricated assembly 32 containing predominantly glass layers 34; predominantly ceramic layers 36, metal lines 38 and metal vias 40. The structure is readily made by tape casting as described and screen printing to provide lines 38 and filling to provide vias 40 and stacking and aligning, pressing, drying and binder removal in conventional fashion. The assembly 32 can be co-fired either by itself or attached, e.g., by pressing, to a monolithic ceramic structure 42 as indicated by curly bracket 44 whereby better reliability is obtained as described above. Where structure 42 is utilized, the ceramic can be any of those mentioned above and can be selected for a particular function as described above.

Depicted by reference numeral 46 is a load which can optionally be exerted downwardly as denoted by arrows 48 during the sintering process in order to reduce warping as described above. This can be carried out simply by positioning a weight on the assembly 32 in anticipation of sintering. The magnitudes of pressure are described above.

In the above structures, the thickness of the predominantly glass layers in the green state can typically range from 5 microns to 500 microns, and the thickness of the predominantly ceramic layers in the green state can typically range from 5 microns to 500 microns. When used, the monolithic substrate 42 typically has a thickness greater than 0.1 mm; normally the thickness does not exceed 5 mm. The total thickness of the assembly in the green state, without the monolithic substrate, typically ranges from 20 microns to 5 millimeters.

Figure 4:
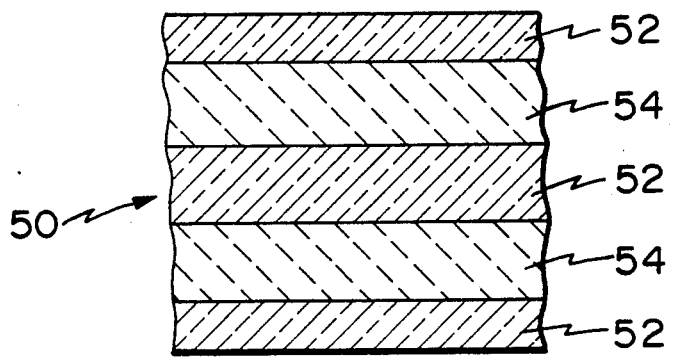
FIG. 4 schematically represents in section a five layer, green substrate, the making of which is described herein to demonstrate the operativity of the invention.

Turning now to FIG. 4, a five layer green structure as indicated by reference numeral 50 contains alternating predominantly glass layers 52 and predominantly ceramic layers 54. The layers 52 were constructed from 100% glass on a glass plus ceramic basis with an average glass particle size of 5 microns. The glass had the following composition on a weight percentage basis: $SiO_2$ (56.8%) $B_2O_3$ (4.3%), $Al_2O_3$ (15.5%) CaO (10.0%), BaO (6.0%), MgO (6.9%) and $As_2O_3$ (0.5%). The glass particles were obtained commercially. The layers 52 had a thickness of about 50 microns. The layer 54 were constructed on a glass plus ceramic basis of 20% by volume glass particles (same glass particles as described above) and 80% by volume aluminum nitride particles having an average particle size of 1 micron and a specific surface area of 3.8 $in^2/g$. The aluminum nitride particles were obtained commercially. The layers 54 had a thickness of about 100 microns.

The structure depicted in FIG. 4 was prepared using conventional tape casting, stacking, pressing, drying and binder removal procedures.

The structure of FIG. 4 was co-fired at 850° C. for 3 to 4 hours in air.

Figure 5:
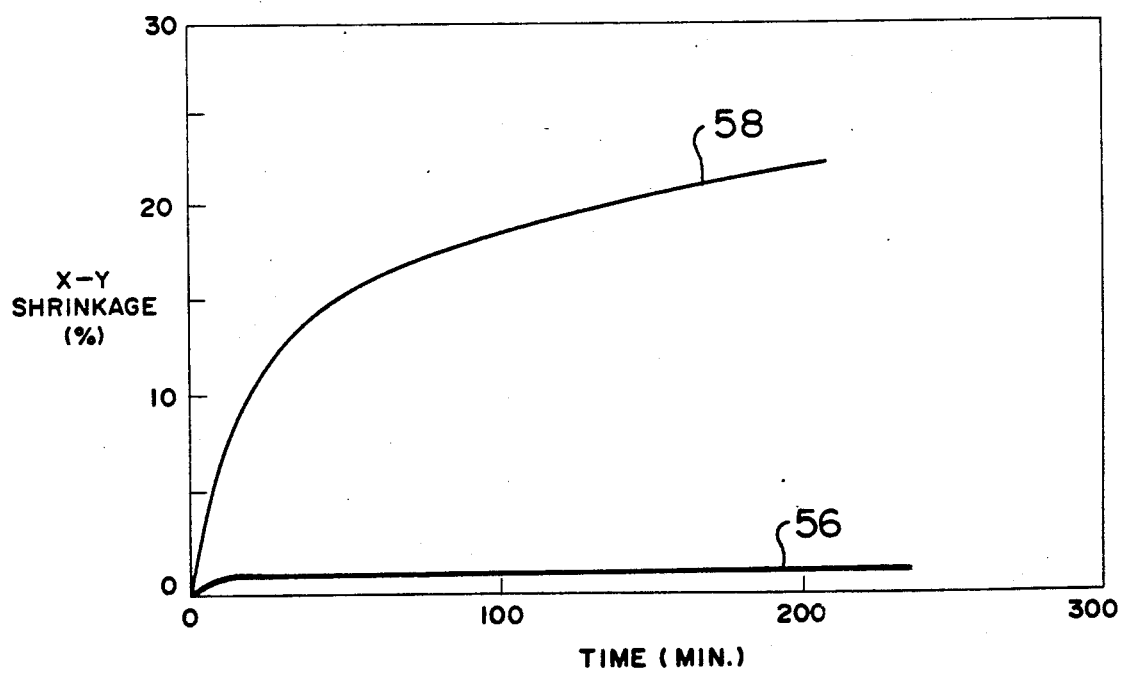
FIG. 5 is a graph of x-y line shrinkage versus time for a single layer of glass versus a multilayer structure according to the invention.

FIG. 5 depicts the shrinkage obtained on co-firing. The graph denoted by reference numeral 56 represents the co-fired product of FIG. 4. The graph denoted by reference numeral 58 represents a single predominantly glass 50 micron thick layer (containing 0% by volume aluminum nitride ceramic and 100% by volume glass on a glass plus ceramic basis). Results of similar shrinkage with some variation in respect to times are obtained with a single predominantly glass 50 microns thick layer containing up to 40% ceramic on a glass plus ceramic basis. Similar results are obtained with tapes of other thicknesses falling in the ranges described earlier.

Variations will be evident to those skilled in the art. Thus the invention is defined by the claims.

What is claimed is:

1. A multilayer green substrate assembly for sintering to provide a multilayer circuit, said multilayer green substrate comprising:

(a) at least one layer predominantly containing glass particles held together by an organic binder;
(b) at least one layer predominantly containing ceramic particles held together by an organic binder, said ceramic particles being composed of ceramic material which is wetted by the glass without significant dissolution or sintering, being such as to remain rigid at sintering temperatures and being such as to stabilize the substrate against shrinkage in the x-y plane on sintering and to substantially constrain shrinkage on sintering to the z-direction;
(c) at least one layer of (a) or (b) or (a) and (b) being printed with a metal conductive pattern.

2. The substrate of claim 1 wherein each layer (a) contains on a glass plus ceramic basis at least 60% by volume glass and wherein each layer (b) contains on a glass plus ceramic basis at least 60% by volume ceramic.

3. The substrate of claim 2 wherein said glass has a sintering temperature ranging from 600° C. to 1500° C.

4. The substrate of claim 3 wherein said glass has a sintering temperature ranging from 800° C. to 900° C.

5. The substrate of claim 2 wherein said ceramic is selected from the group consisting of carbides, nitrides, oxides and borides.

6. The substrate of claim 5 wherein said ceramic is aluminum nitride.

7. The substrate of claim 4 wherein said ceramic is diamond or poorly crystallized carbon.

8. The substrate of claim 2 wherein each layer (b) contains on a glass plus ceramic basis from 10% to 30% by volume glass and from 90% to 70% by volume ceramic.

9. A multilayer substrate for mounting of electronic or opto-electronic components, said substrate comprising (a) at least one layer which has a glass matrix and has a porosity from 0 to 10% by volume and contains from 0 to 60% by volume ceramic;
(b) at least one layer which contains at least 60% by volume ceramic particles with the remainder being any combination of porosity and glass;
the ceramic of (a) and the ceramic particles of (b) being composed of ceramic material which is wetted by the glass without significant dissolution or sintering.

10. The substrate of claim 9 which is self-supporting.

11. The substrate of claim 9 which is built on a monolithic ceramic substrate of ceramic selected from carbides, nitrides, oxides and borides.

12. The substrate of claim 9 wherein at least one of (a) or (b) or (a) and (b) is printed with a metal conductive pattern.

13. The substrate of claim 9 wherein the layer (a) has a low dielectric constant and the layer (b) has either a low or high dielectric constant or is a resistor.

14. The substrate of claim 13 wherein the layer (b) has electro-optic properties.

15. A multilayer green substrate assembly for fabrication of multilayer packages with metal circuits, said multilayer green substrate comprising:

(a) at least one layer predominantly containing glass particles held together by an organic binder;
(b) at least one layer predominantly containing ceramic particles held together by an organic binder, said ceramic particles being composed of ceramic material which is wetted by the glass without significant dissolution or sintering, being such as to remain rigid at sintering temperatures and being such as to stabilize the substrate against shrinkage in the x-y plane on sintering and to substantially constrain shrinkage on sintering to the z-direction.

16. The assembly of claim 15 which consists of a three layer structure where the outer layers are layers (a) which contain on a glass plus ceramic basis at least 60% by volume glass and a middle layer (b) which contains on a glass plus ceramic basis at least 60% by volume ceramic.

17. In the method for producing a self standing substrate for a multilayer circuit which method comprises the steps of tape casting, screen printing, stacking, laminating, and removing organic binder to provide a green multilayer assembly comprising glass and ceramic which is composed of material which is wetted by the glass without significant dissolution or sintering, and co-firing, the improvements comprising co-firing under a pressure applied in the z-direction and with shrinkage essentially only in the z-direction and essentially no shrinkage in the x-y plane.

18. The method of claim 17 wherein the co-firing is carried out with the green multi-layer assembly built on a monolithic ceramic substrate thereby to provide greater reliability by the elimination of delamination and interface defects that otherwise result from shrinkage in the x-y plane.

19. The method of claim 18 wherein co-firing is carried out under a pressure applied in the z-direction in the range of 3 to 30 psi thereby to prevent warping and improve adhesion between layers and said monolithic ceramic substrate.

20. The method of claim 17 where co-firing is carried out under a pressure applied in the z-direction in the range of 3 to 30 psi thereby to improve adhesion between layers and to reduce the possibility of warping.

* * * * *